US011843877B2

(12) United States Patent
Park et al.

(10) Patent No.: US 11,843,877 B2
(45) Date of Patent: *Dec. 12, 2023

(54) IMAGE SENSOR COMPRISING ARRAY OF COLORED PIXELS

(71) Applicant: Samsung Electronics Co., Ltd., Suwon-si (KR)

(72) Inventors: Heeryung Park, Busan (KR); Juhyun Ko, Hwaseong-si (KR); Jinwoo Kim, Seoul (KR); Joonyoung Park, Seoul (KR); Jongmin You, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/156,685

(22) Filed: Jan. 19, 2023

(65) Prior Publication Data

US 2023/0156352 A1    May 18, 2023

Related U.S. Application Data

(63) Continuation of application No. 17/142,652, filed on Jan. 6, 2021, now Pat. No. 11,575,859.

(30) Foreign Application Priority Data

May 4, 2020  (KR) .................. 10-2020-0053244

(51) Int. Cl.
*H04N 25/447*    (2023.01)
*H01L 27/146*    (2006.01)
(Continued)

(52) U.S. Cl.
CPC ..... *H04N 25/447* (2023.01); *H01L 27/14623* (2013.01); *H01L 27/14627* (2013.01);
(Continued)

(58) Field of Classification Search
CPC .. H04N 25/447; H04N 25/534; H04N 25/702; H01L 27/14623; H01L 27/14627; H01L 27/14641; H01L 27/14621
See application file for complete search history.

(56) References Cited

U.S. PATENT DOCUMENTS 7,154,075 B2   12/2006  Krymski
7,911,507 B2   3/2011   Egawa et al.
(Continued)

FOREIGN PATENT DOCUMENTS

JP    2016-040874 A    3/2016

*Primary Examiner* — Gevell V Selby
(74) *Attorney, Agent, or Firm* — Harness, Dickey & Pierce, P.L.C.

(57) ABSTRACT

An image sensor includes a Bayer pattern-type pixel array including a plurality of Bayer pattern-type extended blocks each having first to fourth pixel blocks, each of the first to fourth pixel blocks including first to fourth pixels, the first and fourth pixels of the first and fourth pixel blocks being configured to sense green light, the first and fourth pixels of the second and third pixel blocks being configured to sense red light and blue light, respectively, and the second and third pixels of the first to fourth pixel blocks being configured to sense white light, and a signal processing unit merging Bayer pattern color information generated from the first and fourth pixels of the first to fourth pixel blocks, and the Bayer pattern illuminance information generated from the second and third pixels of the first to fourth pixel blocks.

20 Claims, 13 Drawing Sheets

(51) Int. Cl.
*H04N 25/534* (2023.01)
*H04N 25/702* (2023.01)

(52) U.S. Cl.
CPC ..... *H01L 27/14641* (2013.01); *H04N 25/534* (2023.01); *H04N 25/702* (2023.01); *H01L 27/14621* (2013.01)

(56) References Cited

U.S. PATENT DOCUMENTS

| | | |
|---|---|---|
| 8,139,130 B2 | 3/2012 | Compton et al. |
| 8,314,863 B2 | 11/2012 | Tachi |
| 9,137,452 B2 | 9/2015 | Han |
| 9,137,472 B2 | 9/2015 | Minagawa et al. |
| 9,357,137 B2 | 5/2016 | Mitsunaga |
| 9,455,285 B2 | 9/2016 | Keelan et al. |
| 11,575,859 B2 * | 2/2023 | Park .................. H04N 25/704 |
| 2010/0128039 A1 | 5/2010 | Cho et al. |
| 2014/0049670 A1 | 2/2014 | Kim et al. |
| 2017/0118424 A1 | 4/2017 | Lule et al. |
| 2017/0201693 A1 * | 7/2017 | Sugizaki ............... H04N 25/57 |
| 2019/0020865 A1 | 1/2019 | Kang et al. |
| 2019/0182446 A1 * | 6/2019 | Tsunai ................ H04N 25/134 |
| 2019/0306472 A1 | 10/2019 | Buettner |

* cited by examiner

BP1

|   | 1 | 2 | 3 | 4 |
|---|---|---|---|---|
| 1 | G | R | G | R |
| 2 | B | G | B | G |
| 3 | G | R | G | R |
| 4 | B | G | B | G |

|   | 1 | 2 | 3 | 4 |
|---|---|---|---|---|
| 1 | W | W | W | W |
| 2 | W | W | W | W |
| 3 | W | W | W | W |
| 4 | W | W | W | W |

FIG. 4B

MCI

|   | 1 | 2 | 3 | 4 |
|---|---|---|---|---|
| 1 | G' | R' | G' | R' |
| 2 | B' | G' | B' | G' |
| 3 | G' | R' | G' | R' |
| 4 | B' | G' | B' | G' |

| W | W | W |
|---|---|---|
| W | W | W |
| W | W | W |

FIG. 13B

IMAGE SENSOR COMPRISING ARRAY OF COLORED PIXELS

CROSS-REFERENCE TO RELATED APPLICATION(S)

This application is a continuation of U.S. application Ser. No. 17/142,652, filed on Jan. 6, 2021, which claims the benefit under 35 USC 119(a) of Korean Patent Application No. 10-2020-0053244 filed on May 4, 2020 in the Korean Intellectual Property Office, the entire disclosure of each of which is incorporated herein by reference for all purposes.

BACKGROUND

Some example embodiments relate to an image sensor.

Image sensors that capture an image of an object and convert the image into an electrical signal are not only used in consumer electronics such as digital cameras, mobile phone cameras, and portable camcorders, but also in cameras mounted in automobiles, security devices, and/or robots. Such an image sensor includes a pixel array, and each pixel included in the pixel array may include a light sensing element.

To increase the resolution of the image sensor, the size of the pixel is continuously reduced, and the sensitivity of the light sensing element of each pixel may be reduced due to the reduction in the pixel size. As a result, the image quality of the image may deteriorate.

SUMMARY

Some example embodiments provide an image sensor in which a dynamic range (DR) and/or a signal-to-noise ratio (SNR) may be improved by compensating for low sensitivity of color pixels.

According to some example embodiments, an image sensor includes a Bayer pattern-type pixel array including a plurality of Bayer pattern-type extended blocks each having first to fourth pixel blocks arranged in a big 2×2 matrix, each of the first to fourth pixel blocks including first to fourth pixels arranged in a small 2×2 matrix, the first and fourth pixels of the first and fourth pixel blocks configured to sense green light, the first and fourth pixels of the second and third pixel blocks configured to sense red light and blue light, respectively, and the second and third pixels of the first to fourth pixel blocks configured to sense white light; and, a signal processing circuitry configured to generate Bayer pattern color information by binning signals of the first and fourth pixels of the first to fourth pixel blocks, to generate Bayer pattern illuminance information by binning signals of the second and third pixels of the first to fourth pixel blocks, and to generate a color image by merging the Bayer pattern color information and the Bayer pattern illuminance information.

According to some example embodiments, an image sensor includes a pixel array including a plurality of Bayer pattern-type extended blocks each having first to fourth pixel blocks, the first to fourth pixel blocks respectively including a plurality of pixels arranged in a plurality of rows and a plurality of columns, the plurality of pixels being divided into first and second groups each having at least two pixels, pixels of a first group of the first and fourth pixel blocks respectively configured to sense first color light, pixels of a first group of the second pixel block configured to sense second color light, pixels of a first group of the third pixel configured to sense third color light, and pixels of a second group of the first to fourth pixel blocks respectively configured to sense light of a wavelength band wider than a wavelength band of each of at least second and third color light, respectively, and a signal processing circuitry configured to generate Bayer pattern color information by binning signals of pixels of the first group of the first to fourth pixel blocks, to generate Bayer pattern illuminance information by binning signals of pixels of a second group of the first to fourth pixel blocks, and to generate a color image by merging the Bayer pattern color information and the Bayer pattern illuminance information.

According to some example embodiments, an image sensor includes a pixel array including a plurality of Bayer pattern-type extended blocks each having first to fourth pixel blocks arranged in a big 2×2 matrix, each of the first to fourth pixel blocks including first to fourth pixels arranged in a small 2×2 matrix, the first and fourth pixels of the first and fourth pixel blocks configured to receive light of a first color, the first and fourth pixels of the second and third pixel blocks configured to receive light of second and third colors, respectively, and the second and third pixels of the first to fourth pixel blocks configured to receive white light, and a signal processing circuitry configured to generate Bayer pattern color information by binning signals of the first and fourth pixels of the first to fourth pixel blocks, and to generate the Bayer pattern illuminance information by binning signals of the second and third pixels of the first to fourth pixel blocks. The first and fourth pixel blocks are arranged in a first diagonal direction, the second and third pixel blocks are arranged in a second diagonal direction, the first and fourth pixels are arranged in one of the first diagonal direction and the second diagonal direction, and the second and third pixels are arranged in the other of the first diagonal direction and the second diagonal direction.

BRIEF DESCRIPTION OF DRAWINGS

The above and other aspects, features, and advantages of the example embodiments will be more clearly understood from the following detailed description, taken in conjunction with the accompanying drawings, in which:

FIGS. 4A and 4B respectively illustrate Bayer pattern color (e.g., RGB) information and illuminance information generated by signal processing of an image sensor according to some example embodiments;

FIG. 5 illustrates a Bayer pattern color image in which a color array pattern illustrated in FIG. 4A and the illuminance information illustrated in FIG. 4B are merged.

FIGS. 13A and 13B respectively illustrate Bayer pattern color information and illuminance information generated by signal processing of an image sensor according to some example embodiments.

DETAILED DESCRIPTION OF SOME EXAMPLE EMBODIMENTS

Hereinafter, various example embodiments will be described in detail with reference to the accompanying drawings.

Figure 1:
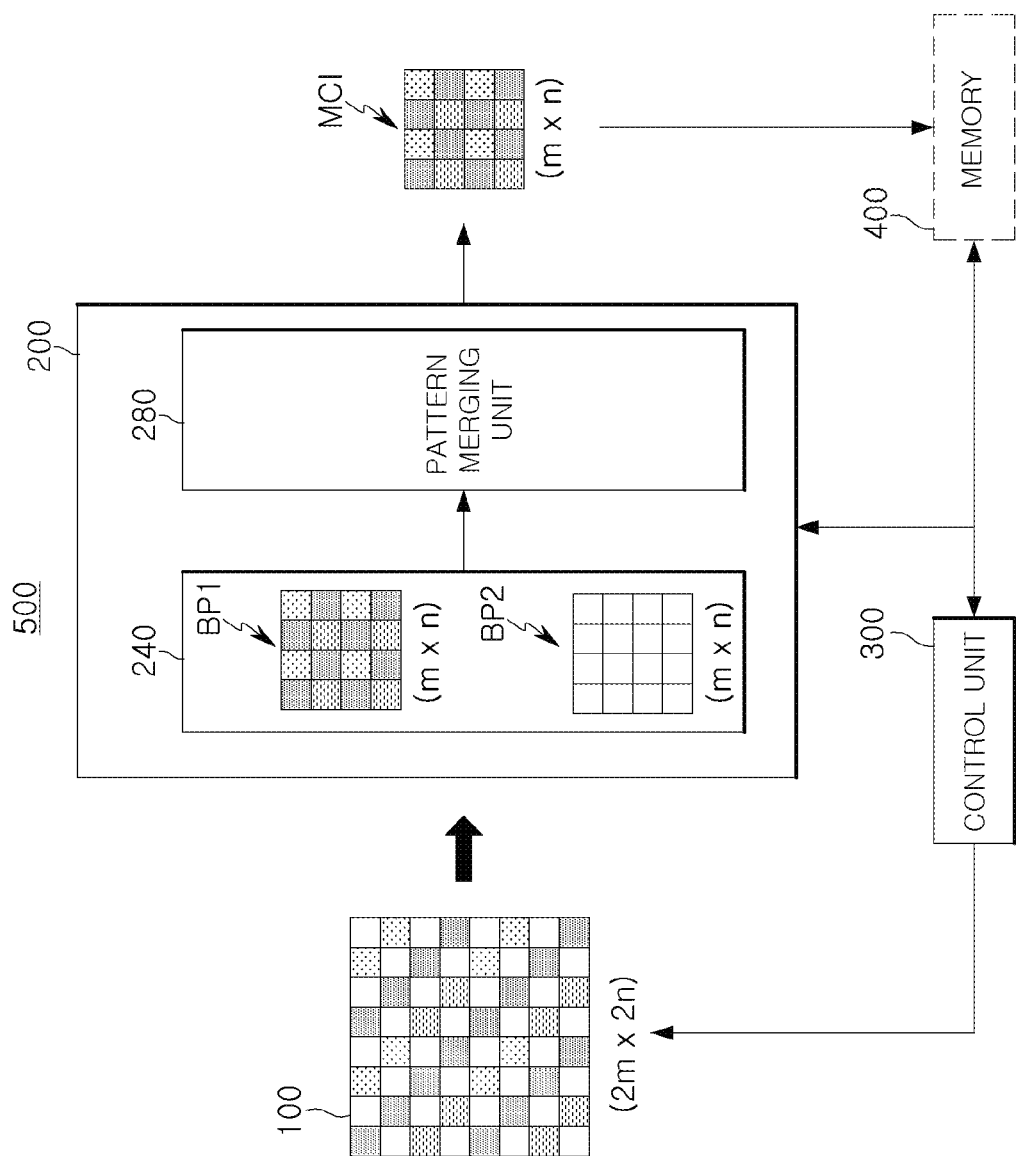
FIG. 1 is a block diagram illustrating the structure of an image sensor according to some example embodiments.

FIG. 1 is a block diagram illustrating the structure of an image sensor according to some example embodiments.

Referring to FIG. 1, an image sensor 500 according to some example embodiments may include a pixel array 100, a signal processing unit 200, and a control unit 300. The image sensor 500 may further include a memory 400.

Figure 3:
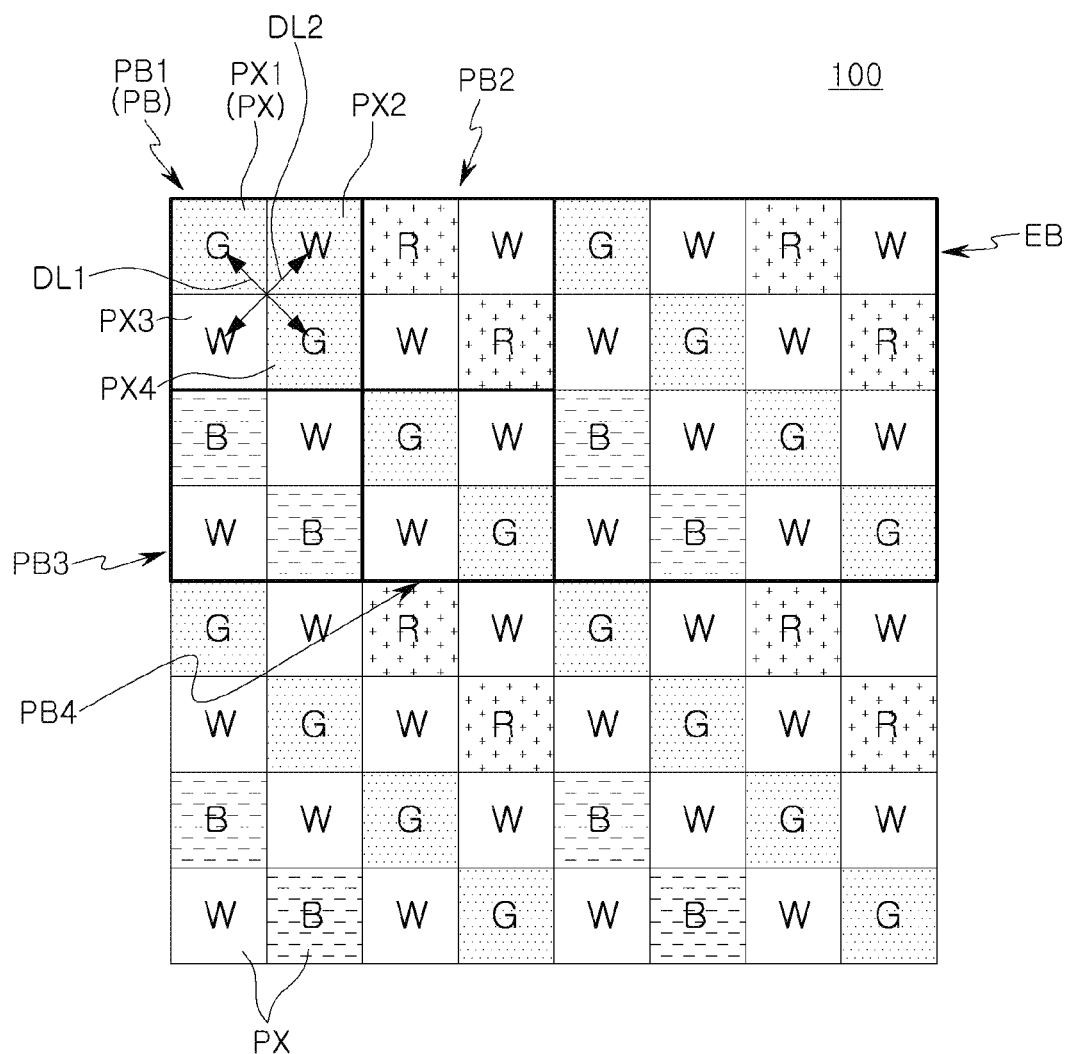
FIG. 3 is a plan view illustrating a pixel array employable in an image sensor according to some example embodiments.

As illustrated in FIG. 3 to be discussed below in more detail, the pixel array 100 employed in some example embodiments may have a plurality of pixels PX constituting/ included in an extended Bayer pattern block EB. The extended Bayer pattern block EB may be respectively comprised of four pixel blocks PB1, PB2, PB3 and PB4, e.g. arranged adjacently as illustrated. Each of the plurality of pixels PX may include an optical sensing element that converts an optical signal into an electrical signal. For example, the light sensing element may be or include or correspond to a photodiode.

The plurality of pixels PX may include red, green, and blue pixels R, G and B configured to receive red, green, and blue light, respectively, and white pixels W, configured to receive white light. The white pixel W may have higher sensitivity than the red, green, and blue pixels R, G, and B. The red, green and blue pixels R, G, and B include red, green, and blue filters, respectively to receive light in a specific wavelength band (e.g. the wavelength band of red, green, and blue light, respectively), whereas the white pixel W may receive the light covering the wavelength band of red, green, and blue without a filter. The red, green, and blue pixels R, G, and B and the white pixel W receive light of one of red, green, blue, and white in the unit of a pixel through a micro lens (see, e.g., micro lens 109 in FIG. 8), and the optical sensing element may generate and output electrical signals corresponding to the intensity of light received by photoelectric conversion.

In some example embodiments, the plurality of pixels PX constituting/included in the pixel array 100 may be arranged in a plurality of rows and a plurality of columns. For example, FIG. 3 illustrates a form in which 64 pixels PX are arranged in an 8×8 matrix for convenience of description, but the form may have an array (e.g., 1920×1080) of one million or more pixels. In detail, as described above, the arrangement as described above may constitute/be included in a pixel block (PB1, PB2, PB3, PB4) unit and an extended Bayer pattern block (EB) unit.

In detail, the pixel array 100 may include a plurality of extended Bayer pattern blocks EB respectively having first to fourth pixel blocks PB1, PB2, PB3 and PB4 arranged in a 2×2 matrix (e.g. in a larger matrix), e.g. arranged adjacently as illustrated. The first to fourth pixel blocks PB1, PB2, PB3 and PB4 may be arranged in a larger matrix, and may each include first to fourth pixels PX1, PX2, PX3 and PX4 arranged in a smaller 2×2 matrix, e.g. arranged adjacently as illustrated.

In each of the plurality of extended Bayer pattern blocks EB employed in some example embodiments, the first and fourth pixel blocks PX1 and PX4 may be arranged in a first diagonal (DL1) direction, and the second and three pixel blocks PX2 and PX3 may be arranged in a second diagonal (DL2) direction.

Further, the first and fourth pixels PX1 and PX4 of the first and fourth pixel blocks PB1 and PB4 may be green pixels G configured to sense green light. The first and fourth pixels PX1 and PX4 of the second and third pixel blocks PB2 and PB3 may be red and green pixels R and G configured to sense red light and blue light, respectively. The second and third pixels PX2 and PX3 of the first to fourth pixel blocks PB1, PB2, PB3 and PB4 may be white pixels W configured to sense white light.

In some example embodiments, in each of the first to fourth pixel blocks PB1, PB2, PB3, and PB4, the first and fourth pixels PX1 and PX4 may be arranged in the direction of the first diagonal DL1, and the second and third pixel blocks PX2 and PX3 may be arranged in the direction of the second diagonal DL2 direction. In some example embodiments, the first to fourth pixel blocks PB1, PB2, PB3 and PB4 may be arranged in a direction opposite to the direction in this example embodiment. For example, the first and fourth pixels PX1 and PX4 are arranged in the second diagonal DL2 direction, and the second and third pixel blocks PX2 and PX3 may be arranged in the first diagonal DL1 direction.

As such, in some example embodiments, the first and fourth pixels PX1 and PX4 are provided as color pixels indicated by R, G, and B, and the second and third pixels PX2 and PX3 may be provided as illuminance sensing pixels to improve sensitivity. The illuminance sensing pixel may be configured to receive light in a band wider than the wavelength band of the color pixel, and may include, for example, a yellow pixel and/or a white pixel W.

According to some example embodiments, a "pixel block" refers to a unit in which a plurality of color pixels (e.g., PX1 and PX4) and a plurality of luminance sensing pixels (e.g., PX2 and PX3) are combined and arranged, and "extended Bayer pattern block" refers to a unit in which four pixel blocks PB are arranged in a Bayer pattern. In some example embodiments, in terms of color pixels of the first to fourth pixel blocks PB1, PB2, PB3, and PB4, the extended Bayer pattern block EB may be understood to implement a Bayer array pattern of R-G-G-B. In addition, the Bayer pattern color pattern information BP1 illustrated in FIG. 4A may have a Bayer array pattern of R-G-G-B corresponding to such a Bayer array.

As illustrated in FIG. 1, output signals of the pixel array 100 are input to a binning pattern generation unit 240 of the signal processing unit 200. The binning pattern generation unit 240 may bin RGBW array data obtained from the pixel array 100 into a color signal comprised of RGB and an illuminance signal comprised of W, and may generate color pattern information BP1 and illuminance pattern information BP2 generated from the binned color signal and illuminance signal, respectively. Since the color pattern information BP1 and the illuminance pattern information BP2 are respectively generated through such binning, signal processing such as gain and/or offset may be independently performed on the two pattern information BP1 and BP2.

The color pattern information BP1 and the illuminance pattern information BP2 generated by the binning pattern generation unit 240 have a Bayer pattern as illustrated in FIGS. 4A and 4B. The respective patterns constituting the color pattern information BP1 and the illuminance pattern information BP2 may be or correspond to or be based on data based on/associated with signals obtained from one pixel block PB of the pixel array 100.

For example, green pattern information of a first row and a first column of the color pattern information BP1 may be obtained from the signals of the two green pixels PX1 and PX4 of the first pixel block PB1. White pattern information of a first row and a first column of the illuminance pattern information BP2 may be obtained from signals of the remaining two white pixels PX2 and PX3 of the first pixel block PB1.

As described above, since respective patterns of the color pattern information BP1 and the illuminance pattern information BP2 are generated from one pixel block PB comprised of four pixels PX, the resolution (m×n) of the Bayer pattern color information may be ¼ (one quarter) of the resolution (2m×2n) of the pixel array 100. The illuminance pattern information BP2 may also have a Bayer pattern in the same arrangement as the color pattern information BP1.

Figure 5:
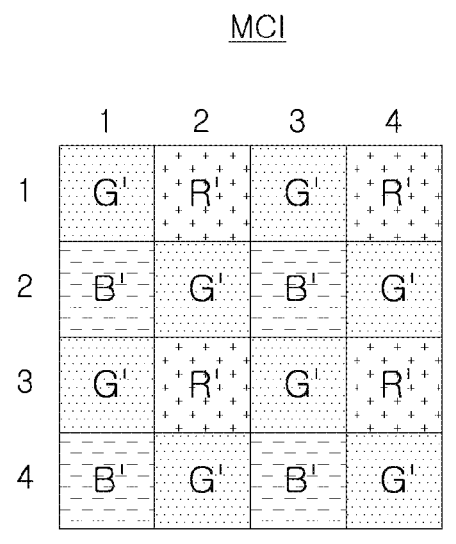

In the binning pattern generation unit 240, the color pattern information BP1 and the illuminance pattern information BP2 having the same Bayer pattern are input to a pattern merging unit 280 of the signal processing unit 200. The color pattern information BP1 and the illuminance pattern information BP2 may be merged to provide a color image MCI having the same resolution as the color pattern information BP1 (as illustrated in FIG. 5). The merging process may be performed in such a manner that patterns in positions corresponding to each other in the color pattern information BP1 and the illuminance pattern information BP2 one-to-one merge with each other (e.g. are overlaid with each other). The respective colors R, G, and B of the color pattern information BP1 may have improved sensitivity characteristics by the illuminance data at the corresponding position of the illuminance pattern information BP2, thereby providing a color image MCI having converted colors R', G' and B'.

As described above, according to some example embodiments, the color pattern information BP1 obtained from the respective first and fourth pixels PX1 and PX4 is improved, e.g. greatly improved in sensitivity characteristics such as SNR and/or DR by binned illumination information BP2, and as a result, since respective pattern data of the illuminance pattern information BP2 is information obtained from white pixels located/arranged adjacent in the same pixel block PB as that of the first and fourth pixels PX1 and PX4 associated with the color signal to be merged, the sensitivity may be appropriately improved according to the environment, e.g. neighborhood, of relevant pixels.

In some example embodiments, a corrected color image MIC may be stored in the memory 400. The control unit 300 may control the signal processing unit 200 to perform a series of processes. For example, a program including machine-readable instructions that executes a series of processes may be stored in the memory 400, and the control unit 300 may control the series of processes by executing a program read from the memory 400.

According to some example embodiments, the color pattern information BP1 and the illuminance pattern information BP2 have a resolution of ¼ (one quarter) of the resolution (2m×2n) of the physical pixel array, and the color image MCI has a form of the same resolution (m×n) as that of the color pattern information BP1, but example embodiments are not limited thereto, and the configuration may be configured to have a different resolution.

For example, the color pattern information BP1, the illuminance pattern information BP2, and the color image MCI may be implemented to have a different resolution from that in other example embodiments, by differently configuring digital signal processing. In some example embodiments, the color pattern information BP1 and the illuminance pattern information BP2 may have the same resolution as that of the physical pixel array (2m×2n).

In some embodiments, the color pattern information BP1 has the same resolution as that of the pixel array (2m×2n), but the illuminance pattern information BP2 may have a resolution of ¼ of the resolution of the pixel array (2m×2n). In this case, the color image MCI has the same resolution as the color pattern information BP1, and the merging process of the color pattern information BP1 and the illuminance pattern information BP2 may be performed as a merging process of 4:1 (color pattern: illuminance pattern) rather than one-to-one correspondence.

Figure 2:
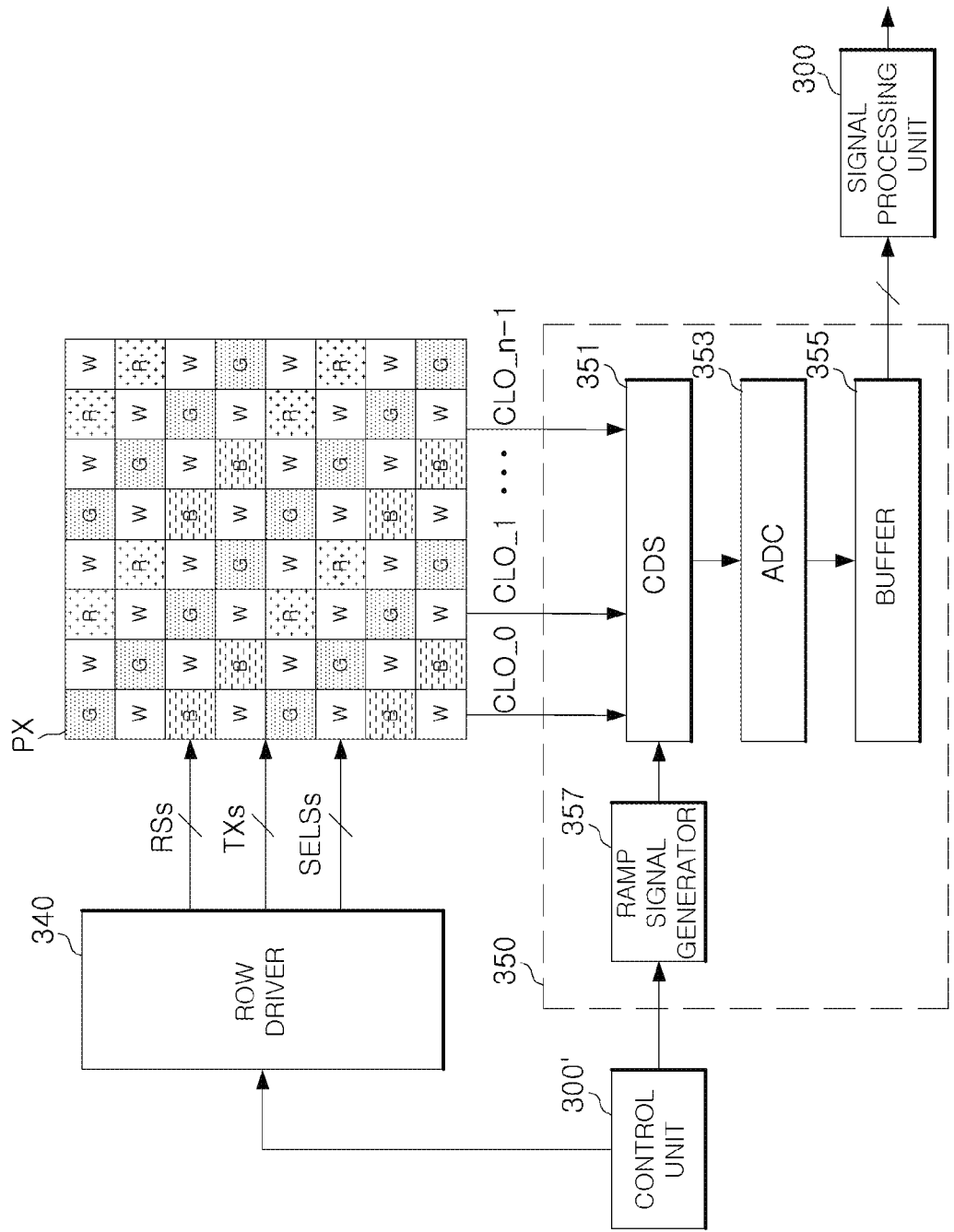
FIG. 2 is a block diagram schematically illustrating an image sensor according to some example embodiments.

As illustrated in FIG. 2, the image sensor 500 according to some example embodiments may include a row driver 340 driven by a control unit 300' together with the pixel array 100, the signal processing unit 200, and the control unit 300'.

As described above, the pixel array 100 may include a plurality of pixels PX arranged in the unit of an extended Bayer pattern block EB and a plurality of pixel blocks PB. Each of the pixels PX may include a corresponding light sensing element. For example, the light sensing element may be or include a photodiode. The plurality of pixels PX absorb light to generate charge, and may provide an electrical signal (output voltage) to the signal reader 350, according to the generated charge may be.

The control unit 300' may control the row driver 340 to enable the pixel array 100 to absorb light to accumulate charge, temporarily store accumulated charge, and output an electrical signal according to the stored charge to the outside of the pixel array 100. Alternatively or additionally, the control unit 300' may control the signal reader 350 to measure the output voltage provided by the pixel array 100. The control unit 300' illustrated in FIG. 2 is/corresponds to a control unit responsible for a control function configured to drive the pixel array 100 and read signals, and may be understood as the control unit 300 responsible for a portion of functions of the control unit illustrated in FIG. 1.

The row driver 340 may generate signals such as RSs, TXs, and SELSs for controlling the pixel array 100, and provide the signals to the plurality of pixels PX included in the pixel array 100. The row driver 340 may determine activation and deactivation timings of reset control signals RSs, transmission control signals TXs, and/or selection signals SELSs for the plurality of pixels PX, and may provide other signals to the plurality of pixels PX included in the pixel array 100.

The signal reader 350 may include a correlated double sampler (CDS) 351, an analog-to-digital (A/D) converter (ADC) 353, and/or a buffer 355. The correlated double sampler 351 may sample and hold the output voltage provided by the pixel array 100. The correlated double sampler 351 may double-sample a level according to a specific noise level and the generated output voltage, and may output a level corresponding to the difference. Alternatively or additionally, the correlated double sampler 351 may receive ramp signals generated by a ramp signal generator 357, and may compare the signals to output a comparison result. The A/D converter 353 may convert an analog signal corresponding to a level received from the correlated double sampler 351 into a digital signal. The buffer 355 may latch digital signals, and the latched signals may be sequentially output to the signal processing unit 200 and/or the outside of the image sensor 500.

The signal processing unit 200 may perform signal processing on the received data of the plurality of pixels PX. In addition to the process of generating a Bayer pattern color image by combining a color pattern and an illuminance pattern obtained through the above-described binning, the signal processing unit 200 may perform various image signal processing for image quality improvement, such as array interpolation, other noise reduction processing, gain adjustment, waveform shaping processing, and/or color filter array interpolation, white balance processing, gamma correction, edge emphasis processing, and/or the like. Alternatively or additionally, the signal processing unit 200 may output information regarding a plurality of pixels PX to a processor (not illustrated) during phase difference auto-focusing to perform phase difference calculation (see FIGS. 8 to 11).

In some example embodiments, the signal processing unit 200 is illustrated as being implemented in a portion of the image sensor 500, in detail, in a logic circuit, but may also be implemented in a processor (not illustrated) separately provided outside of the image sensor 500.

Figure 6:
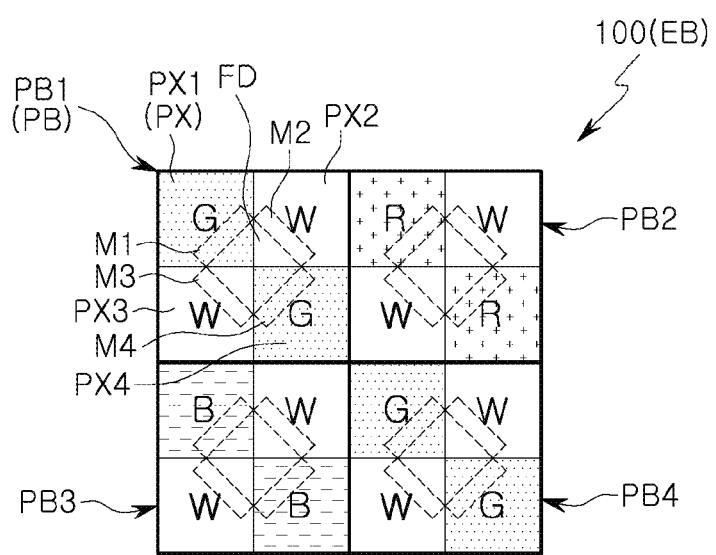
FIG. 6 is a partial plan view illustrating a pixel array illustrated in FIG. 1.

FIG. 6 is a partial plan view illustrating the pixel array illustrated in FIG. 1.

Referring to FIG. 6, a portion of the pixel array 100 illustrated in FIG. 1, for example, one extended Bayer pattern block EB is illustrated.

The extended Bayer pattern block EB includes first to fourth pixel blocks PB1, PB2, PB3, and PB4 arranged in a 2×2 matrix (e.g. arranged adjacently as illustrated and as described above), and the first to fourth pixel blocks PB1, PB2, PB3, and PB4 include first and fourth pixels PX1 and PX4 arranged diagonally, each of the first and fourth pixels PX1 and PX4 included in different pixel blocks PB1 to PB4 receiving light of different colors, and second and third pixels PX2 and PX3 receiving white light, respectively.

The first to fourth pixel blocks PB1, PB2, PB3, and PB4 employed in some example embodiments may include one floating diffusion FD shared by the first to fourth pixels PX1, PX2, PX3, and PX4, and transistors M1, M2, M3, and M4 (e.g. transfer transistors) disposed between the first to fourth pixels PX1, PX2, PX3, and PX4 and the floating diffusion FD. The charges accumulated in photodiodes PD1, PD2, PD3, and PD4 of the first to fourth pixels PX1, PX2, PX3, and PX4 may be transmitted to the floating diffusion FD, through the transistors M1, M2, M3, and M4 connected to the photodiodes PD1, PD2, PD3 and PD4, respectively. As such, the four pixels PX1, PX2, PX3, and PX4 located in the same pixel block PB1, PB2, PB3, and PB4 may share one floating diffusion FD. When one floating diffusion FD is shared as in some example embodiments, the same color information may be read with a time difference. For example, some transistors M1 and M4 may simultaneously be turned ON to store and read green information from the photodiodes PD1 and PD4 in floating diffusion FD, and subsequently, some other transistors M2 and M3 may be simultaneously turned ON to store and read the illuminance (e.g., white) information from the photodiodes PD2 and PD3 in the floating diffusion FD.

In some example embodiments, the floating diffusion FD may be disposed to be shared by two adjacent same color pixels, such that two floating diffusions FD may be provided in one pixel block. For example, the green pixels PX1 and PX4 may share one floating diffusion FD, and the white pixels PX2 and PX3 may share the other floating diffusion FD. In this case, all the transistors M1 to M4 are simultaneously turned ON to store information in two floating diffusions FD, and green information and white information may be simultaneously read.

Figure 7:
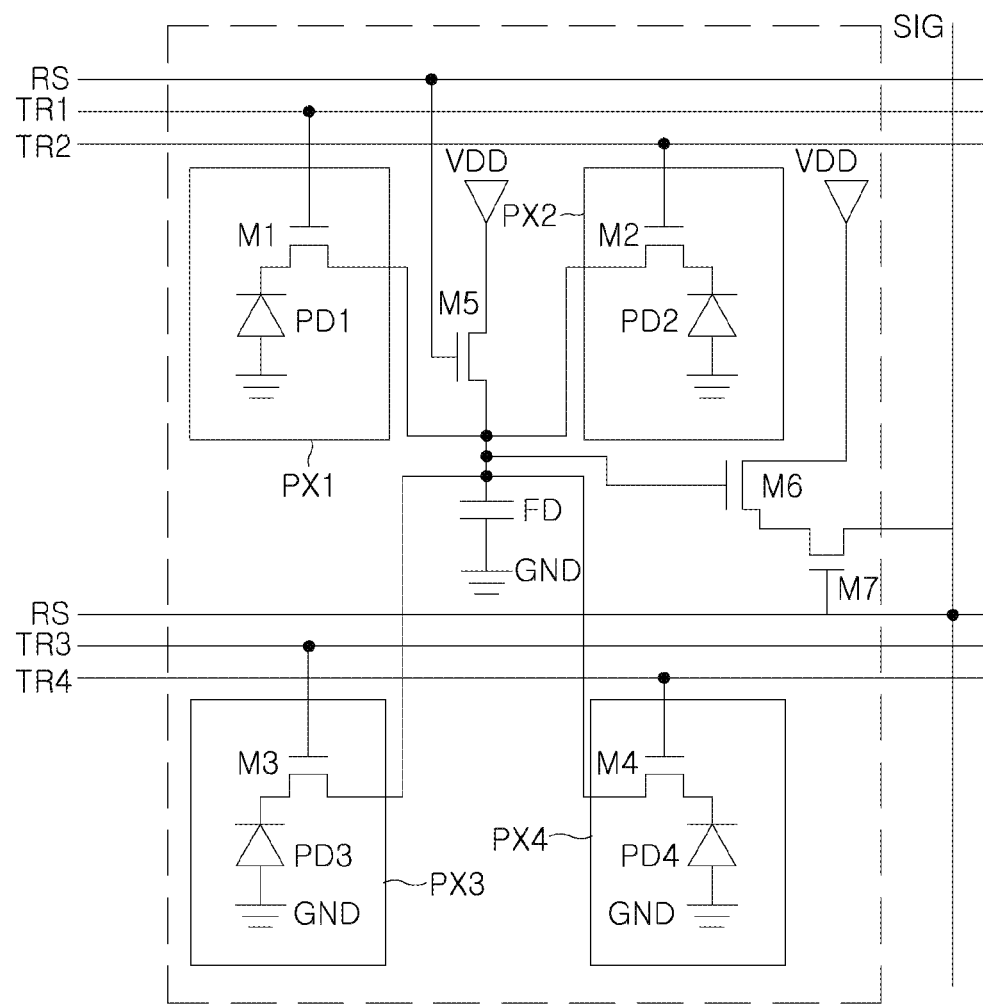
FIG. 7 illustrates an example of a driving circuit corresponding to the pixel array illustrated in FIG. 6.

FIG. 7 illustrates a circuit of the pixel block PB1 including four pixels PX1, PX2, PX3, and PX4 illustrated in FIG. 6, as a portion of a pixel circuit corresponding to a pixel array.

The process of generating an image signal in each pixel will be described with reference to FIG. 7.

When light enters the pixel, charges depending on the amount of light are generated in (within) the photodiodes PD1, PD2, PD3, and PD4 by photoelectric conversion. The charges accumulated in the photodiodes PD1, PD2, PD3 and PD4 are transmitted to the floating diffusion FD through the transistors (transfer transistors) M1, M2, M3 and M4. The transistors M1, M2, M3 and M4 may be controlled by control signals of transmission signal lines TR1, TR2, TR3, and TR4, respectively. The operation process may be described in detail with reference to FIG. 7.

First, a reset signal RS is applied to the (reset) transistor M5 and the charge accumulated in the floating diffusion FD is reset. When the charge amount sufficiently reaches the reset level, a row select signal SL is applied to the transistor M4, and a source current of the transistor M3 based on the charge amount of the floating diffusion FD flows to a column signal line SIG, and may be transmitted to an A/D converter 353 (see FIG. 6) as a reset level.

Next, the reset signal RS and the row select signal SL are turned OFF, a transmission signal TS is applied to the transistor M5, and the charge generated by the photodiode PD1 is transmitted to the floating diffusion FD. When the transmission is sufficiently completed, the column select signal SL is applied to the transistor M7, and a source current of the transistor M6 based on the amount of charge of the floating diffusion FD flows to a row signal line SIG, and may be transmitted to the A/D converter (see A/D converter 313 in FIG. 2) as a pixel signal level. In the A/D converter, the correct pixel signal may obtain the correct pixel signal by detecting a difference between the reset level and the pixel signal level.

As such, in the pixel circuit according to some example embodiments, the transistors M5, M6 and M7 together with the floating diffusion FD may be shared by the pixels PX1, PX2, PX3, and PX4 in (within) the same pixel block.

In some example embodiments, in the pixel block PB of a 2×2 matrix, the exposure time of some pixels may be adjusted differently from the exposure time of other pixels. For example, the pixels PX1 and PX4 of the same color of the first to fourth pixel blocks PB1, PB2, PB3, and PB4 may be controlled with different exposure times. Similarly, the same white pixels PX2 and PX3 in each pixel block may be controlled with different exposure times. This control may be performed by the control unit 300' illustrated in FIG. 2; however, example embodiments are not limited thereto.

For example, the control unit (300 in FIG. 2) may control the pixels PX1 and PX3 located in the 2m−1 (m≥1)-th row among the first to fourth pixels PX1, PX2, PX3 and PX4 by a first exposure time, and may control the pixels PX2 and PX4 positioned in the 2m-th row by a second exposure time shorter than the first exposure time.

As such, the signal of the pixel by the first exposure time (e.g., a long time) and the signal of the pixel by the second exposure time (a short time) are synthesized by enabling the same color pixels of the same pixel block to be different by the first and second exposure times, a wide dynamic range (WDR) may be provided, and the final color image (MCI) may be expressed in detail with light and dark areas.

Figure 8:
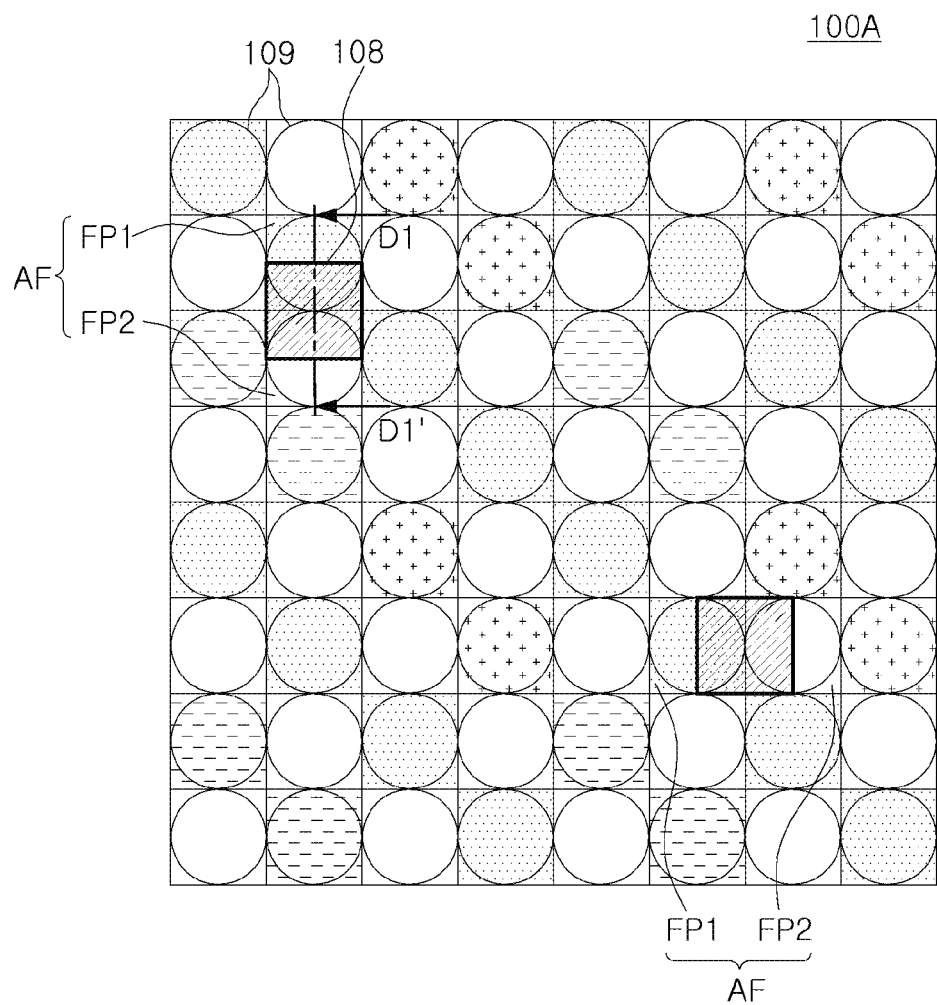
FIG. 8 is a plan view illustrating a pixel array (including autofocusing pixels) according to some example embodiments.
Figure 9:
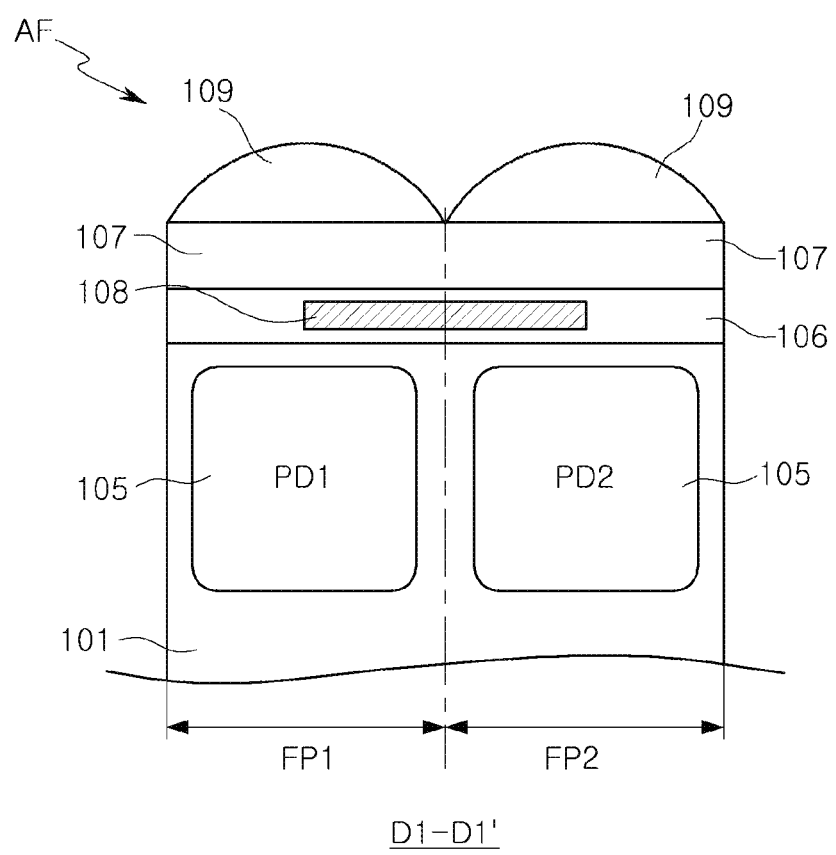
FIG. 9 is a cross-sectional view illustrating an autofocusing pixel of the pixel array illustrated in FIG. 8.

FIG. 8 is a plan view illustrating a pixel array (including autofocusing pixels) according to an example embodiment, and FIG. 9 is a cross-sectional view illustrating an autofocusing pixel of the pixel array illustrated in FIG. 8.

Referring to FIGS. 8 and 9, a pixel array 100A according to some example embodiments may be understood to be similar to the pixel array 100 of FIG. 3 except that it has a pixel (or a shared pixel for phase detection) for autofocusing. Alternatively or additionally, the components of this example embodiment may be understood by referring to the description of the same or similar components of the pixel array 100 described in FIGS. 1 to 3, unless specifically stated to the contrary.

The pixel array 100A according to this example embodiment includes a plurality of pixels PXs disposed in a plurality of rows and a plurality of columns, and may be arranged in the unit of a pixel block (PB) and an extended Bayer patterned block (EB) similarly to the pixel array 100 illustrated in FIG. 3. The plurality of pixels PX may include a shared pixel AF for phase detection, for autofocusing.

The shared pixel AF for phase detection each includes first and second phase detection pixels FD1 and FD2 for sensing light of the same color. For example, the first and second phase detection pixels FD1 and FD2 may include pixels for sensing green light. Unlike the other pixels for obtaining image information, the first and second phase detection pixels FD1 and FD2 may be used not only for an autofocusing function using a phase difference, but also for measurement of a distance between an object and an image sensor.

Since the first and second phase detection pixels FD1 and FD2 are disposed adjacent to each other and configured to sense the same color, the first and second phase detection pixels FD1 and FD2 may partially deviate from the regularity of the arrangement employed in the pixel array according to this example embodiment. The information of pixels outside the regularity of the arrangement may be replaced with information of other adjacent pixels in the case of a signal processing process. For example, in the signal processing process, a second phase detection pixel FD2 may be replaced with information of other white pixels located in the same pixel block.

A plurality of shared pixels AF for phase detection may be disposed in different areas. In some example embodiments, the first and second phase detection pixels FD1 and FD2 may include a pair arranged in a row direction and a pair arranged in a column direction.

In detail, referring to FIG. 9, the first and second phase detection pixels PD1 and PD2 include light sensing elements PD1 and PD2, light shielding layers 108, an insulating layer 106, a color filter layer 107, and a micro lens 109, respectively. The light shielding layer 108 employed in this example embodiment is disposed in the insulating layer 106 and may include a reflective metal material. The light shielding layer 108 employed in this example embodiment may have a shape spanning between two pixels FD1 and FD2.

The light shielding layer 108 may block a portion of light incident to the light sensing elements PD1 and PD2. A difference in the amount of light received by the light sensing elements PD1 and PD2 may occur depending on the incident direction of light. As described above, it may be determined whether focusing is obtained based on the difference in the amount of light received by the first and second phase detection pixels FD1 and FD2. Based on this, a lens (not illustrated) may be adjusted to automatically focus. The shared pixel AF for phase detection in which the first and second phase detection pixels FD1 and FD2 are arranged in the row direction are used to adjust the focusing in the horizontal direction, and the shared pixel AF for phase detection in which the first and second phase detection pixels FD1 and FD2 are arranged in the column direction may be used to adjust the focus in the vertical direction.

Figure 10:
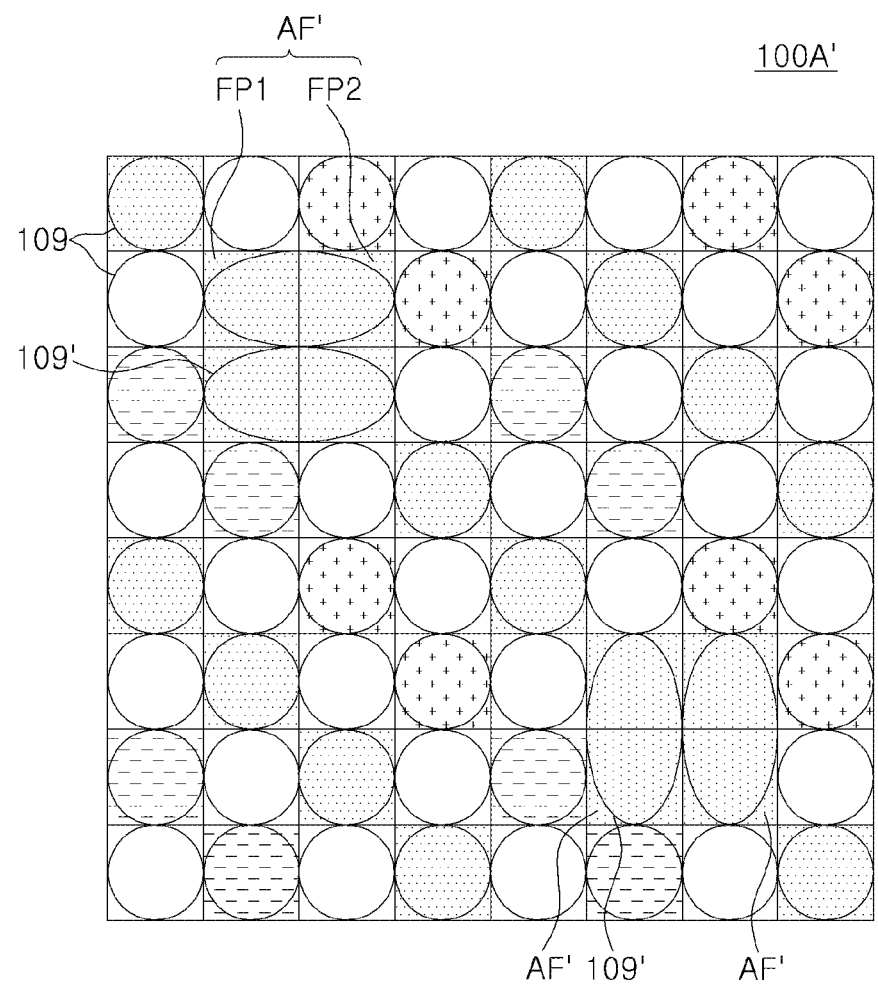
FIG. 10 is a plan view illustrating a pixel array (including an autofocusing pixel) according to some example embodiments.
Figure 11:
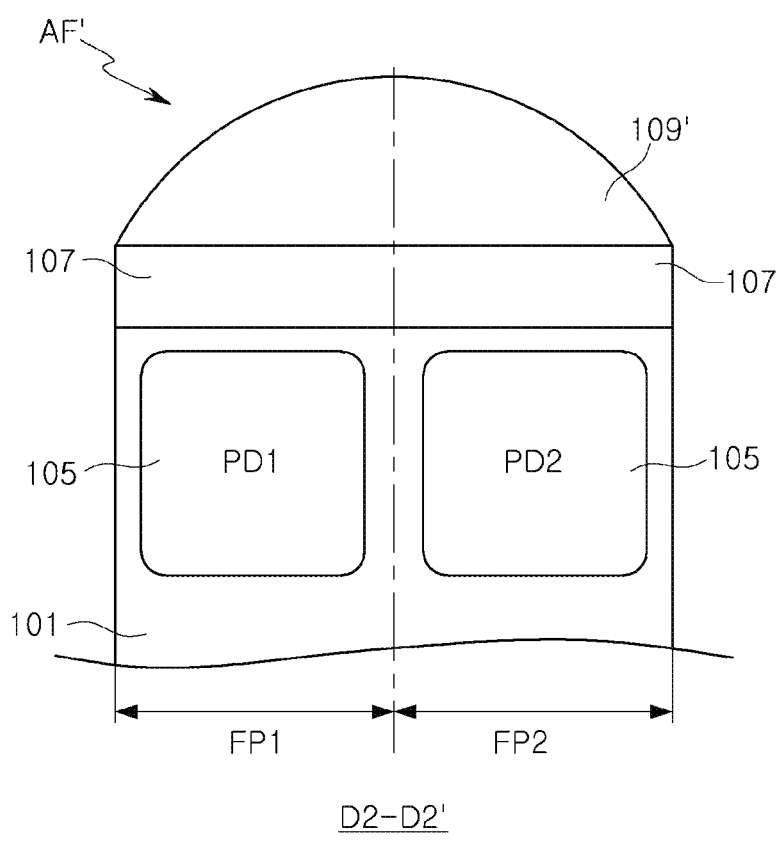
FIG. 11 is a cross-sectional view illustrating an autofocusing pixel of the pixel array illustrated in FIG. 10.

FIG. 10 is a plan view illustrating a pixel array (including autofocusing pixels) according to an example embodiment, and FIG. 11 is a cross-sectional view illustrating an autofocusing pixel of the pixel array illustrated in FIG. 10.

Referring to FIGS. 10 and 11, a pixel array 100A' according to some example embodiments may be understood to be similar to the pixel array 100A of FIGS. 8 and 9 except that the pixel structure for autofocusing is different. In addition, the components of these example embodiments may be understood by referring to the descriptions of the same or similar components of the pixel arrays 100 and 100A described in FIGS. 1 to 3 and FIGS. 8 and 9, unless otherwise specified.

The shared pixel AF for phase detection, used in the previous embodiment, is illustrated in the form of using the light shielding layer 108, but a shared pixel AF' for phase detection according to this example embodiment may include one micro lens 109' configured to be shared by first and second phase detection pixels FD1' and FD2', rather than the light shielding layer 108.

The micro lenses 109' shared by the first and second phase detection pixels FD1' and FD2' may adjust incident light directed to respective light sensing elements PD1 and PD2. The first and second phase detection pixels FD1 and FD2 may output different phase signals depending on the shape and/or refractive index of the micro lens 109' employed in this example embodiment. Focus may be adjusted based on different phase signals. Similar to some example embodiments, the shared pixel AF for phase detection in which the first and second phase detection pixels FD1 and FD2 are arranged in the row direction is used to adjust the focus in the horizontal direction, and the shared pixel AF for phase detection in which the first and second phase detection pixels FD1 and FD2 are arranged in the column direction may be used to adjust the focus in the vertical direction.

Figure 12:
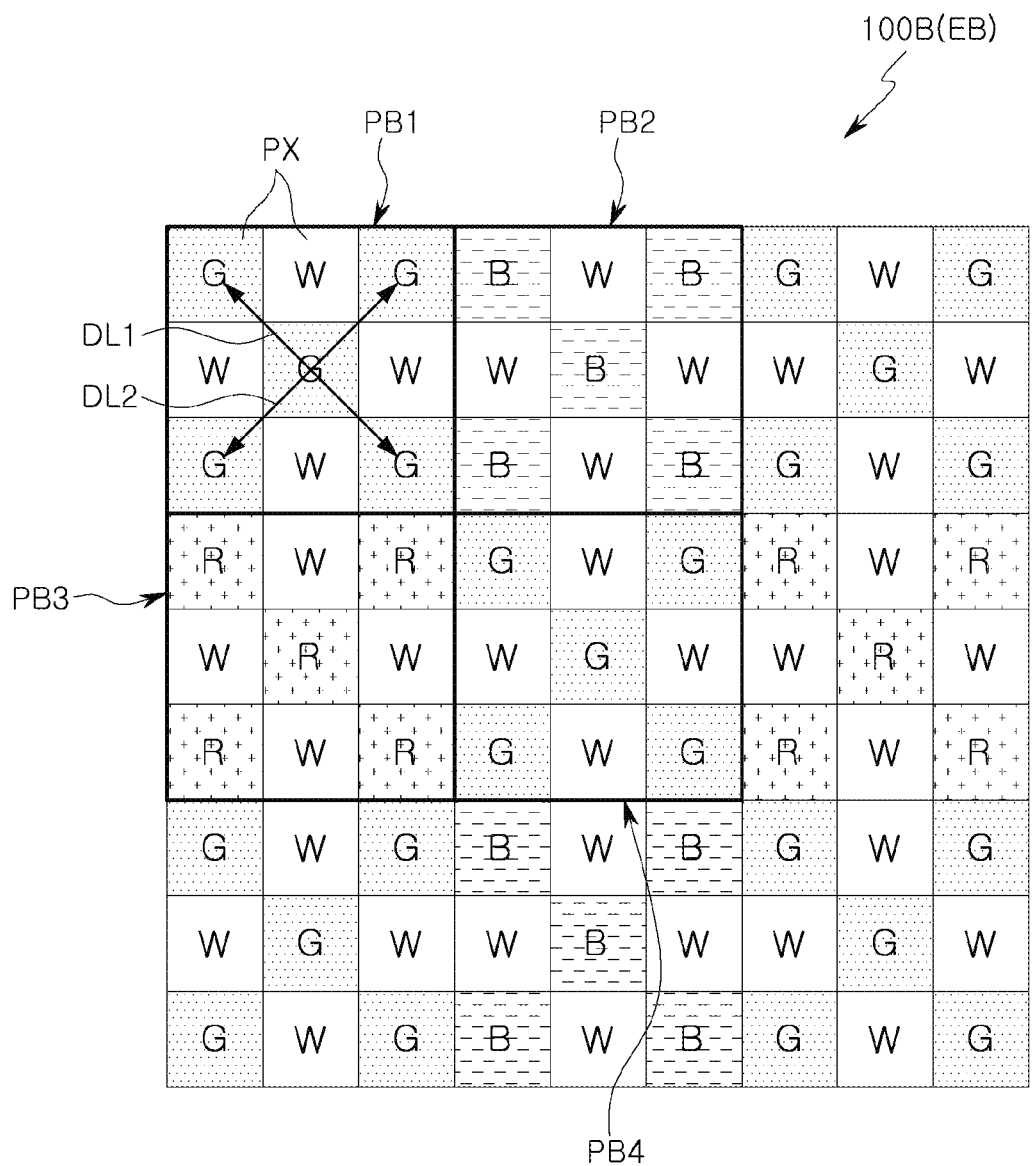
FIG. 12 is a plan view illustrating a pixel array employable in an image sensor according to some example embodiments.
Figures 13A, 13B:
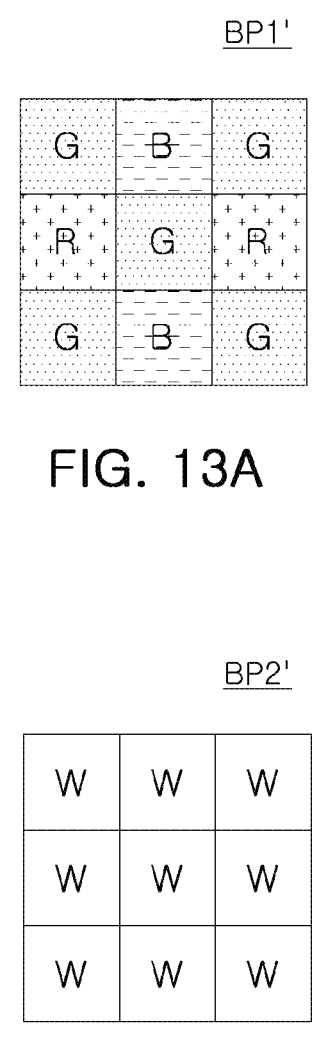

FIG. 12 is a plan view illustrating a pixel array employable in an image sensor according to some example embodiments, and FIGS. 13A and 13B illustrate color information and illuminance information generated by signal processing of an image sensor according to an example embodiment, respectively.

Referring to FIG. 12, a pixel array 100B according to this example embodiment may be understood to be similar to the pixel array 100 of FIG. 3 except that the pixel (or a shared pixel for phase detection) is provided for autofocusing. In addition, the components of some example embodiments may be understood by referring to the descriptions of the same or similar components of the pixel array 100 described in FIGS. 1 to 3, unless specifically stated to the contrary.

The pixel array 100B includes a plurality of pixels PX arranged in a plurality of rows and a plurality of columns, and similar to the previous embodiment, may be arranged in the unit of the pixel blocks PB1, PB2, PB3, and PB4 and the extended Bayer pattern blocks (EB).

Referring to FIG. 12, similar to the pixel array 100 illustrated in FIG. 3, the pixel array 100B includes a plurality of extended Bayer pattern block (EB) having first to fourth pixel blocks PB1, PB2, PB3, and PB4, respectively arranged in a 2×2 matrix, but unlike the some example embodiments, the first to fourth pixel blocks PB1, PB2, PB3, and PB4 may each include nine pixels PX arranged in a 3×3 matrix.

In each of the pixel blocks PB1, PB2, PB3 and PB4, 5 pixels PX arranged in two diagonal directions DL1 and DL2 are configured to detect light of color, and the remaining four pixels may be configured to detect white light. In detail, the five color pixels PX of the first and fourth pixel blocks PB1 and PB4 may be green pixels G configured to sense green light. The five color pixels PX of the second and third pixel blocks PB2 and PB3 may be red and green pixels R and G configured to sense red light and blue light, respectively. The four white pixels PX of the first to fourth pixel blocks PB1, PB2, PB3 and PB4 may be/correspond to white pixels W configured to sense white light.

As described above, the "pixel block (PB1, PB2, PB3, PB4)" employed in some example embodiments may have various pixel arrangements in which a plurality of color pixels and a plurality of illuminance detection pixels are combined, while an "extended Bayer pattern block (EB)" may have an R-G-G-B Bayer pattern in which four pixel blocks PB1, PB2, PB3 and PB4 are arranged, similar to the previous embodiment.

Output signals of the pixel array 100 are binned into a color signal comprised of RGB and an illuminance signal comprised of W in the binning pattern generation unit (240 in FIG. 1), and as illustrated in FIGS. 13A and 13B, color pattern information BP1' and illuminance pattern information BP2' are generated from the binned color and illuminance signals, respectively. Subsequently, the color pattern information BP1' and the illuminance pattern information BP2' may be merged in a pattern merging unit (see 280 of FIG. 1) to provide a color image having the same resolution as the color pattern information BP1'.

Since one pixel block of the pixel array 100 generates one pattern information of the color pattern information BP1' and the illuminance pattern information BP2', the color pattern information BP1', the illuminance pattern information BP2', and the final color image may have a resolution corresponding to an arrangement of pixel blocks. For example, when the number of the first to fourth pixel blocks PB1, PB2, PB3, and PB4 in the pixel array 100 in the row direction and the number of the first to fourth pixel blocks PB1, PB2, PB3, and PB4 in the pixel array 100 in the column direction are m and n, respectively, the Bayer pattern type color and illuminance information (BP1', BP2') and the final color image may each have a resolution of m×n.

The merging process may be performed in such a manner that patterns in positions corresponding to each other in the color pattern information BP1 and the illuminance pattern information BP2 are one-by-one merged with each other. Respective colors R, G, and B of the color pattern information BP1' may provide a color image having improved sensitivity characteristics by illuminance data at a corresponding position of the illuminance pattern information BP2.

As described above, according to some example embodiments, the color pattern information BP1' obtained from five pixels PX in each pixel block improves, e.g. greatly improves sensitivity characteristics such as SNR and DR by the binned illuminance pattern information BP2', and as a result, a Bayer pattern color image having improved, or excellent, image quality may be output. Since respective pattern data of the illuminance pattern information BP2' is information obtained from four white pixels PX positioned adjacent in the same pixel block as the five color pixels PX associated with the color signal to be merged, the sensitivity may be appropriately improved in accordance with the environment/neighborhood of the corresponding pixel.

In the above-described embodiment, although a pixel array provided as a combination of color pixels indicated by R, G and B, and illuminance sensing pixels indicated by W is illustrated, color pixels and/or illuminance sensing pixels may be partially changed. In some example embodiments, at least a portion of the color pixels may be changed to other colors. For example, pixels (in detail, filters) for detecting yellow, cyan, and/or magenta colors may be included. Alternatively or additionally, the illuminance sensing pixel may be configured to detect light in a wider band than the wavelength band of the color pixel. For example, the illuminance sensing pixel may include another pixel, for example, a yellow pixel, in addition to the white pixel W. Alternatively or additionally, the illuminance sensing pixel may be configured to detect light in a band larger than visible wavelength.

As set forth above, according to some example embodiments, a pixel array is constructed by appropriately combining color pixels that receive color (e.g., RGB) and an illuminance sensing pixel (e.g., white) for improving sensitivity, and color pattern information and/or illuminance pattern information may be respectively generated by binning a signal obtained from the pixel array. The color pattern information may be provided as a Bayer pattern, and the illuminance pattern information may be configured as a pattern having illuminance information corresponding to respective pixel information one to one. The color pattern and the illuminance pattern may be merged to output a Bayer pattern color image having improved image quality in terms of SNR and/or Dynamic Range (DR).

Each of, or at least some of, the elements described above, such as but not limited to elements described as "units" or "devices", such as the pattern merging unit 280, the control unit 300, the memory 400, and/or elements ending in "-er" or "-or", may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some example embodiments have been illustrated and described above, it will be apparent to those of ordinary skill in the art that modifications and variations could be made without departing from the scope of example embodiments as defined by the appended claims.

What is claimed is:

1. An image sensor comprising:
    a first 4×4 pixel array including four green pixels, eight white pixels, two blue pixels, and two red pixels; and
    a second 4×4 pixel array including N green pixels, M white pixels, two blue pixels, and two red pixels,
    wherein the N is an integer and greater than 4, and
    wherein the M is an integer and less than 8.

2. The image sensor of claim 1, wherein the second 4×4 pixel array includes a first autofocusing pixel and a second autofocusing pixel.

3. The image sensor of claim 2, further including a microlens, and
    wherein the microlens is disposed on the first and second autofocusing pixels.

4. The image sensor of claim 3, wherein the first and second autofocusing pixels are green pixels.

5. The image sensor of claim 4, wherein a first blue pixel, a first white pixel, the first autofocusing pixel and the second autofocusing pixel are arranged in one of row of the second 4×4 pixel array.

6. The image sensor of claim 5, wherein the first blue pixel and the first autofocusing pixel and the second autofocusing pixel are arranged sequentially in a first direction, and
wherein the first blue pixel is disposed right next to the first autofocusing pixel.

7. The image sensor of claim 6, further comprising a third autofocusing pixel and a fourth autofocusing pixel, and
wherein the third and fourth autofocusing pixels are green pixels, and
wherein the first autofocusing pixel and the second autofocusing pixel are arranged in the first direction, and
wherein the third autofocusing pixel and the fourth autofocusing pixel are arranged in a second direction perpendicular to the first direction.

8. The image sensor of claim 6, wherein the second 4×4 pixel array includes a third autofocusing pixel and a fourth autofocusing pixel, and
wherein the third autofocusing pixel and the fourth autofocusing pixel are green pixels.

9. The image sensor of claim 8, wherein the first autofocusing pixel and the second autofocusing pixel are arranged in the first direction, and
wherein the second autofocusing pixel and the third autofocusing pixel are arranged in a second direction perpendicular to the first direction.

10. An image sensor comprising:
a 6×5 pixel array including a plurality of white pixels, a plurality of green pixels, a plurality of blue pixels, a plurality of red pixels, and first to fourth autofocusing pixels, and
wherein the first and second autofocusing pixels, first and second white pixels, a first blue pixel, and a first green pixel in the 6×5 pixel array are arranged in a first direction, and
wherein the first green pixel, a third white pixel, a first red pixel, and a third autofocusing pixel in the 6×5 pixel array are arranged in a second direction perpendicular to the first direction.

11. The image sensor of claim 10, wherein the 6×5 pixel array further comprises a fourth autofocusing pixel, a second blue pixel, a fourth white pixel, a second green pixel, and fifth white pixel, and
wherein the third autofocusing pixel, the fourth autofocusing pixel, the second blue pixel, the fourth white pixel, the second green pixel, and the fifth white pixel are arranged in the first direction.

12. The image sensor of claim 11, wherein the fifth white pixel, the second green pixel, the fourth white pixel, the second blue pixel, the fourth autofocusing pixel, and the third autofocusing pixel are sequentially arranged in the first direction.

13. The image sensor of claim 10, further comprising a microlens, and
wherein the microlens is disposed on the first autofocusing pixel and the second autofocusing pixel, and
wherein the first and second autofocusing pixels are green pixels.

14. The image sensor of claim 13, further comprising a fifth white pixel, a second red pixel, and sixth white pixel, and
wherein the second green pixel, the fifth white pixel, the sixth white pixel, and the second red pixel, and the second autofocusing pixel are arranged in the second direction.

15. The image sensor of claim 14, wherein the second autofocusing pixel, the fifth white pixel, the second red pixel, the sixth white pixel, and the second green pixel are sequentially arranged in the second direction.

16. The image sensor of claim 11, wherein the 6×5 pixel array further comprising a fourth autofocusing pixel, and
wherein the first to fourth autofocusing pixels are green pixels, and
wherein the first and second autofocusing pixels are arranged in the first direction and the fourth and third autofocusing pixels are arranged in the first direction.

17. The image sensor of claim 16, further comprising a microlens, and
wherein the microlens is disposed on the first autofocusing pixel and the second autofocusing pixel.

18. The image sensor of claim 17, wherein the first autofocusing pixel is disposed on a first corner out of four corners of the 6×5 pixel array, and
wherein the third autofocusing pixel is disposed on a second corner out of the four corners of the 6×5 pixel array, and
wherein the first corner is located diagonally from the second corner.

19. The image sensor of claim 18, further comprising a fifth autofocusing pixel and a sixth autofocusing pixel.

20. An image sensor comprising:
an 8×8 pixel array including a plurality of white pixels, a plurality of green pixels, a plurality of blue pixels, a plurality of red pixels, first to eighth autofocusing pixels, and first to fourth microlens, and
wherein the first microlens is disposed on the first and second autofocusing pixels, the second microlens is disposed on the third and fourth autofocusing pixels, the third microlens is disposed on the fifth and sixth autofocusing pixels, and the fourth microlens is disposed on the seventh and eighth autofocusing pixel, and
wherein the first and second autofocusing pixels are arranged in a first direction and the third and fourth autofocusing pixels are arranged in a second direction perpendicular to the first direction, and
wherein the first to eighth autofocusing pixels are green pixels.

* * * * *